United States Patent
Shyanmugam et al.

(10) Patent No.: US 8,611,172 B2
(45) Date of Patent: Dec. 17, 2013

(54) CONTROLLING A VOLTAGE LEVEL OF AN ACCESS SIGNAL TO REDUCE ACCESS DISTURBS IN SEMICONDUCTOR MEMORIES

(75) Inventors: Amaranth Shyanmugam, Austin, TX (US); Bikas Maiti, Austin, TX (US); Vincent Phillipe Schuppe, Austin, TX (US); Yew Keong Chong, New Braunfels, TX (US); Martin Jay Kinkade, Austin, TX (US); Hsin-Yu Chen, Austin, TX (US)

(73) Assignee: ARM Limited, Cambridge (GB)

( * ) Notice: Subject to any disclaimer, the term of this patent is extended or adjusted under 35 U.S.C. 154(b) by 29 days.

(21) Appl. No.: 13/476,218

(22) Filed: May 21, 2012

(65) Prior Publication Data
US 2013/0308407 A1    Nov. 21, 2013

(51) Int. Cl.
*G11C 7/00* (2006.01)
(52) U.S. Cl.
USPC .................. 365/226; 365/189.06; 365/189.11

(58) Field of Classification Search
USPC .......................................... 365/198
See application file for complete search history.

(56) References Cited

U.S. PATENT DOCUMENTS

| | | | | |
|---|---|---|---|---|
| 5,297,104 A | * | 3/1994 | Nakashima | 365/230.06 |
| 5,835,420 A | * | 11/1998 | Lee et al. | 365/189.09 |
| 7,042,788 B2 | * | 5/2006 | Miki | 365/226 |

* cited by examiner

*Primary Examiner* — Tan T. Nguyen
(74) *Attorney, Agent, or Firm* — Nixon & Vanderhye P.C.

(57) ABSTRACT

A semiconductor memory storage device having a plurality of storage cells for storing data, each storage cell comprising an access control device and access control circuitry. The access control circuitry is configured to respond to a data access request signal to access a selected storage cell connected to a corresponding selected access control line to: control the voltage control switching circuitry to connect the at least one capacitor to the voltage supply line such that the at least one capacitor is charged by the voltage supply line and a voltage level on the voltage supply line is reduced; and to control the access control line switching circuitry to connect the selected access control line to the voltage supply line having the reduced voltage level.

20 Claims, 6 Drawing Sheets

CONTROLLING A VOLTAGE LEVEL OF AN ACCESS SIGNAL TO REDUCE ACCESS DISTURBS IN SEMICONDUCTOR MEMORIES

TECHNICAL FIELD

The field of the invention relates to the field of data storage and in particular, to the storage and access of data in semiconductor memories.

BACKGROUND

With ever increasing demands to reduce both the size of devices and their power consumption, it is becoming increasingly challenging to design robust semiconductor memories such as SRAM. Each storage cell in an SRAM comprises a feedback loop for holding a data value. In order to write to the feedback loop and store a new value, the input data value must have a high enough voltage level to be able to switch the state stored by the feedback loop if required, while reading from the feedback loop should be performed without disturbing the values stored in any of the feedback loops.

When accessing a storage cell in such memories access devices are turned on in a row by charging a word line, the data lines or bit lines are then connected to the cells. These bit lines have been precharged during a precharge phase and now that the access devices are turned on, either the value stored in the cell is transferred to the bit lines, or a value to be written to the cell is transferred to the bit lines and this is then transferred to the cell via the access transistors. In a write the data value is placed on the bit lines of the cell to be written to by allowing one of the bit lines to decay to zero while driving the other, the access transistors are turned on and the feedback loop is connected to the bit lines and the data value on the bit lines is stored in the feedback loop. When reading from a cell both bit lines are pre-charged and the side of the cell storing a 0 will pull down the bit line when it is connected to it and this change in voltage level can be detected to determine on which side of the feedback loop the 0 is stored. However, the difference in voltage levels between the precharged bit line and the 0 node of the feedback loop may result in the node storing a 0 being pulled up towards 1 resulting in instability in the bit cell and the bit cell flipping value. This is called read disturb and can happen to a cell during a read to a cell or during a write to another cell on the same word line. This is a consequence of the word line turning on all access devices in a row even though only a subset (generally one) of the cells in the row is to be accessed.

In devices where the capacitance of the power node of the wordline driver is high it is difficult to control the voltage transferred to the word line when it is connected to the driver. This can result in wordline voltage rising quickly and access devices being turned on quickly. This results in the pre-charged bit lines being connected to the half-selected storage cells before their voltage levels have decayed significantly making a disturb of the cell more likely.

Memories with a large number of rows and with relatively few columns are particularly, susceptible to this problem as they have increased capacitance on the power node of the wordline driver and the wordline is smaller and therefore voltages can rise more quickly. Furthermore as memories reduce in size process variations increase and therefore so do access disturbs.

It would be desirable to be able to reduce access disturbs of a semiconductor memory.

SUMMARY

A first aspect provides a semiconductor memory storage device for storing data comprising: a plurality of storage cells for storing said data, each storage cell comprising an access control device configured to provide said storage cell with access to or isolation from a data access port in response to an access control signal; access control circuitry configured to transmit said access control signal along one of a plurality of access control lines to control a plurality of said access control devices connected to said one of said plurality of access control lines; said access control circuitry comprising: a voltage supply line for supplying voltage to said access control lines; at least one capacitor; voltage control switching circuitry for connecting said at least one capacitor to said voltage supply line; and access control line switching circuitry for connecting a selected access control line to said voltage supply line; wherein said access control circuitry is configured to respond to a data access request signal to access a selected storage cell connected to a corresponding selected access control line to: control said voltage control switching circuitry to connect said at least one capacitor to said voltage supply line such that said at least one capacitor is charged by said voltage supply line and a voltage level on said voltage supply line is reduced; and to control said access control line switching circuitry to connect said selected access control line to said voltage supply line having said reduced voltage level.

The technology described herein recognises that where the capacitance on the voltage supply line driving the word lines is high it is difficult to control the voltage level of the word line pulse and in particular, this may rise in an uncontrolled manner to a high value very quickly when the voltage supply line is connected to the word line particularly where the word line is short and there are are few storage cells connected to it. This problem is addressed by connecting a capacitor to the voltage supply line to reduce the voltage level on this voltage supply line by removing some of the charge to the capacitor prior to connecting this voltage supply line to the word line. This reduced voltage level decreases the charge initially supplied to the word line and decreases the speed and level that the voltage on the word line rises to during this initial stage. This in turn reduces access disturbs by delaying the moment when the access control devices of the storage cells turn on. It does however, have a power cost associated with it that is related to the charging of the capacitor.

It should be noted that the capacitor is any device that has a capacitance of a suitable value. The suitable value depending on the memory and the capacitance on the voltage supply line. The capacitance of the capacitor needs to be lower than, but of the same order as that of the capacitance on the voltage supply line, such that it reduces the voltage by between 5 and 35%, depending on the characteristics of the memory and the desired performance.

According to an embodiment of the present invention said access control circuitry further comprises pull down switching circuitry for connecting said voltage supply line to a low voltage source, said access control circuitry being configured to control said pull down switching circuitry to provide a connection between said voltage supply line and said low voltage source at substantially a same time as controlling said voltage control switching circuitry to connect said at least one capacitor to said voltage supply line.

Although connecting a capacitor to the voltage supply line may be enough to reduce the voltage to the required value, in some embodiments the reduction in voltage achieved in this manner is neither sufficient nor fast enough to reduce the voltage on the voltage supply line to a suitable value at the required time. In such a case, pull down switching circuitry, in some cases a pull down transistor, is provided between the voltage supply line and a low voltage source and provides a current path allowing charge to leave the voltage supply line and the voltage to drop quickly.

In some embodiments, said voltage control switching circuitry and said pull down switching circuitry are transistors of opposite types arranged in series with each other, said voltage control transistor being switched on causing said pull down transistor to switch on, said access control circuitry further comprising delay circuitry, said control signal turning said voltage control transistor on being transmitted to said pull down transistor via said delay circuitry and causing said pull down transistor to switch off after a delay determined by said delay circuitry.

The pull down switching circuitry should only provide the connection for a short controlled length of time otherwise the voltage level on the voltage supply line will fall too far. In order to provide accurate control of the amount of charge that leaves the voltage supply line the pull down transistor can be used in conjunction with the capacitor such that for a small amount of time determined by a delay circuitry the pull down transistor is turned on and some charge flows to the low voltage source. For a longer length of time the capacitor is connected to the voltage supply line and charge on the voltage supply line charges the capacitor. In this way by controlling the length of time of the delay and the size of the capacitor(s) the amount of charge that leaves the voltage supply line can be controlled such that the voltage reduction is a suitable voltage reduction for providing a particular semiconductor memory device with a low access disturb.

In some embodiments, said access control circuitry further comprises first power switching circuitry for connecting and isolating said voltage supply line with a voltage source;

said access control circuitry being configured to respond to said data access control request to control said first power switching circuitry to isolate said voltage supply line from said voltage source prior to connecting said at least one capacitor to said voltage supply line; and to control said first power switching circuitry to connect said voltage supply line to said voltage source a predetermined time after said selected access control line is connected to said voltage supply line such that said voltage level of said voltage supply line is increased.

In order to initially charge the voltage supply line to the voltage level of the voltage source it is first connected to the power supply and then prior to reducing the voltage level using the capacitor and perhaps the pull down switching circuitry the voltage supply line is isolated from the voltage source. Once the voltage level on the voltage supply line has reduced and it has been connected to the word line for a predetermined amount of time then the voltage supply line is connected to the voltage source and the voltage level rises again to substantially the level of the voltage source. In this way a voltage level substantially equal to the voltage source is supplied to the word line a predetermined time after the data access request has been received. Thus, only at a predetermined time after beginning of the access cycle will the access control devices be turned fully on.

In some embodiments, said access control circuitry further comprises further power switching circuitry for connecting and isolating said voltage supply line with said voltage source, said further power switching circuitry providing a high impedance connection between said voltage supply line and said voltage source, said access control circuitry being configured to respond to said data access control request to control said further power switching circuitry to provide a connection between said voltage supply line and said voltage source at substantially a same time as said pull down switching circuitry is connected to said voltage supply line.

There may be further power switching circuitry that connects the voltage supply line to the voltage source with a high impedance during the time that the pull down circuitry is connected to the voltage supply line. Using a high impedance connection between the voltage supply line and a high voltage source at a time that the voltage supply is also connected to a low voltage source by a pull down transistor provides a voltage divider type circuit that maintains the voltage level of the voltage supply line at a controlled level between the high voltage source and the low voltage source. This is advantageous in memories where the word line has a high capacitance and therefore draws a lot of current. The high impedance connection can provide charge to the voltage supply line and maintain its voltage near the required value even where the word line is drawing a lot of current. Furthermore, the voltage divider prevents the voltage level on the voltage supply line rising to the level of the voltage source.

It should be noted that in the case of a wide memory with word lines with a high capacitance, the word line will draw a lot of current and will itself reduce the voltage level on the voltage supply line and may not require separate circuitry to implement a reduction in voltage level. However the current design is a general design for use with many types of memory and should provide a memory storage device that functions correctly whatever its size and arrangement. Thus, although the reduction in the word line voltage at the beginning of the cycle may not be needed for these wider semiconductor memory storage devices, they will still function in this mode provided that the charge on the word line is controlled such that there is sufficient provided to prevent the word line voltage falling too low. The high impedance switching device between the voltage source and the voltage supply line will provide this control.

In some embodiments, said access control circuitry is configured to control said access control line switching circuitry to connect said selected access control line to said voltage supply line having said reduced voltage level prior to switching said pull down switching circuitry off.

It is advantageous to connect the access control line to the voltage supply line while the pull down switching circuitry and the high impedance switching device are connected to the voltage supply line as they will form a voltage divider that maintains the voltage level. This can be important if the word line has a high capacitance and takes a lot of charge from the voltage supply line.

In some embodiments, said access control circuitry is configured to control said voltage control switching circuitry to isolate said at least one capacitor from said voltage supply line prior to controlling said first power switching circuitry to provide said connection between said voltage supply line and said voltage source.

The capacitor is isolated from the voltage supply line before the voltage supply line is connected to the voltage source. This reduces current flow. Furthermore the isolated capacitor can then be discharged at some point during the cycle ready for charging again in the next data access cycle.

In some embodiments, said access control circuitry further comprises voltage boost circuitry for providing a voltage boost to said access control line and delay circuitry; wherein said access control circuitry is responsive to said data access request being a write request to connect said access control line to a boosted voltage level higher than said voltage level of said voltage source a certain time after said voltage supply line is connected to said access control line.

Although, reducing the voltage level on the word line at the beginning of the data access cycle will reduce access disturbs in the storage cells it will also reduce the ability of the storage cells to write data to a selected cell. Thus, in some embodiments a boost to the word line is provided a predetermined time into the data access cycle which will improve the write yield of the memory. The advantage of providing the boost later in the data access cycle is that the cell being written to will have its data lines driven and thus, the charge on these data lines will not have decayed at this point while the half selected cells will be connected to the data lines where the charge has decayed and thus, the chances of a disturb to these cells occurring when the access control devices are turned fully on by this boosted voltage level is much smaller.

In some embodiments, a capacitance of said at least one capacitor connected to said voltage supply line is selected in dependence upon characteristics of said semiconductor memory storage device.

As noted previously, it is important that the voltage level and charge on the voltage supply line is accurately controlled and this is done using the capacitor and in some embodiments the pull down transistor connected to this line for a predetermined amount of time. The size of the capacitor determines the amount of charge that can flow into this capacitor from the voltage supply line and thus this value is selected depending on the characteristics of the memory and the desired reduction in the voltage level. The characteristics of the memory will depend on the characteristics of the storage cells themselves and also their number and arrangements within the semiconductor and memory device.

In some embodiments, a capacitance of said at least one capacitor connected to said voltage supply line is between 5 and 35% of said capacitance on said voltage supply line.

It may be that a suitable capacitance of the capacitor is between 5 and 35% capacitance from the voltage supply line, this would result in a fall in voltage of about this much and in the case that the pull down switching circuitry is used the voltage will fall more than this.

In some embodiments, said at least one capacitor comprises a plurality of capacitors arranged in parallel said access control circuitry being configured to select said capacitance by selecting a number of said plurality of capacitors to connect to said voltage supply line.

One way of being able to change the selected capacitance connected to the voltage supply line is to use a plurality of capacitors arranged in parallel and tp connect a number of these depending on the capacitance that is required. In such a case, the access control circuitry will control the switching devices connecting each of the capacitors to the voltage supply line and in this way can provide a suitable capacitance as required.

In some embodiments said number is selected in dependence upon a target read stability of said semiconductor memory storage device, while in other embodiments said number is selected in dependence upon a detected value of said reduced voltage level or in dependence upon a target value of said reduced voltage level.

The value of the capacitance required and therefore the number of capacitors selected can be determined in dependence upon the characteristics of the memory and/or on a target read stability or a target reduced voltage level. In such a case, the system can be analysed from time to time to determine that it is still reaching the target values and the capacitance changed as required.

Alternatively, the capacitance value may be changed in real time by detecting values of the reduced voltage levels and if they are not at the required level, changing in the number of capacitors connected to the voltage supply line as required.

In some embodiments, said plurality of storage cells are arranged in at least one array comprising a plurality of rows, a corresponding plurality of access control lines, a plurality of columns and a corresponding plurality of data lines and complementary data lines, each of said storage cells comprising two access control devices for controlling access to said data line and said complementary data line.

Although the semiconductor memory may have a number of forms, in some embodiments it is in the form of an array with the storage cells on a row being connected to the access control lines and the columns having shared data lines and complimentary data lines. The array of storage cells may comprise an SRAM memory.

A second aspect of the present invention provides a method of providing data access to a semiconductor memory storage device comprising a plurality of storage cells for data, each storage cell comprising an access control device configured to provide said storage cell with access to or isolation from a data access port in response to an access control signal, said method comprising:

in response to a data access request:

connecting at least one capacitor to said voltage supply line such that said at least one capacitor is charged by said voltage supply line and a voltage level of said voltage supply line is reduced;

connecting said voltage supply line having a reduced voltage level to an access control line, said access control line transmitting said access control signal to a plurality of said access control devices providing access to a corresponding plurality of said storage cells.

A third aspect of the present invention provides a semiconductor memory storage means for storing data comprising:

a plurality of storage cells for storing said data, each storage cell comprising an access means for providing said storage cell with access to or isolation from a data access port in response to an access control signal;

access control means for transmitting said access control signal along one of a plurality of access control lines to control a plurality of said access means connected to said one of said plurality of access control lines;

said access control means comprising:

a voltage supply line means for supplying voltage to said access control lines;

at least one capacitor;

voltage control switching means for connecting said at least one capacitor to said voltage supply line; and access control line switching means for connecting a selected access control line to said voltage supply line; wherein said access control means is for accessing a selected storage cell connected to a corresponding selected access control line in response to a data access request signal by:

controlling said voltage control switching circuitry to connect said at least one capacitor to said voltage supply line such that said at least one capacitor is charged by said voltage supply line and a voltage level on said voltage supply line is reduced; and controlling said access control line switching circuitry to connect said selected access control line to said voltage supply line having said reduced voltage level.

A fourth aspect of the present invention provides a computer program product comprising a computer program which when executed on a computer causes said computer to generate a lay out for a semiconductor memory storage device according to a first aspect of the present invention.

The memory may be generated on a computer program and be a memory compiler in which the layout of the memory according to the first aspect of the present invention is generated. The specific number of storage cells and characteristics may be input as variables to the computer program to generate the required memory.

The above, and other objects, features and advantages of this invention will be apparent from the following detailed description of illustrative embodiments which is to be read in connection with the accompanying drawings.

BRIEF DESCRIPTION OF THE DRAWINGS

FIG. 2b shows timing diagrams of control signals controlling the access control circuitry of FIG. 2a;

DESCRIPTION OF THE EXAMPLE NON-LIMITING EMBODIMENTS

Figure 1:
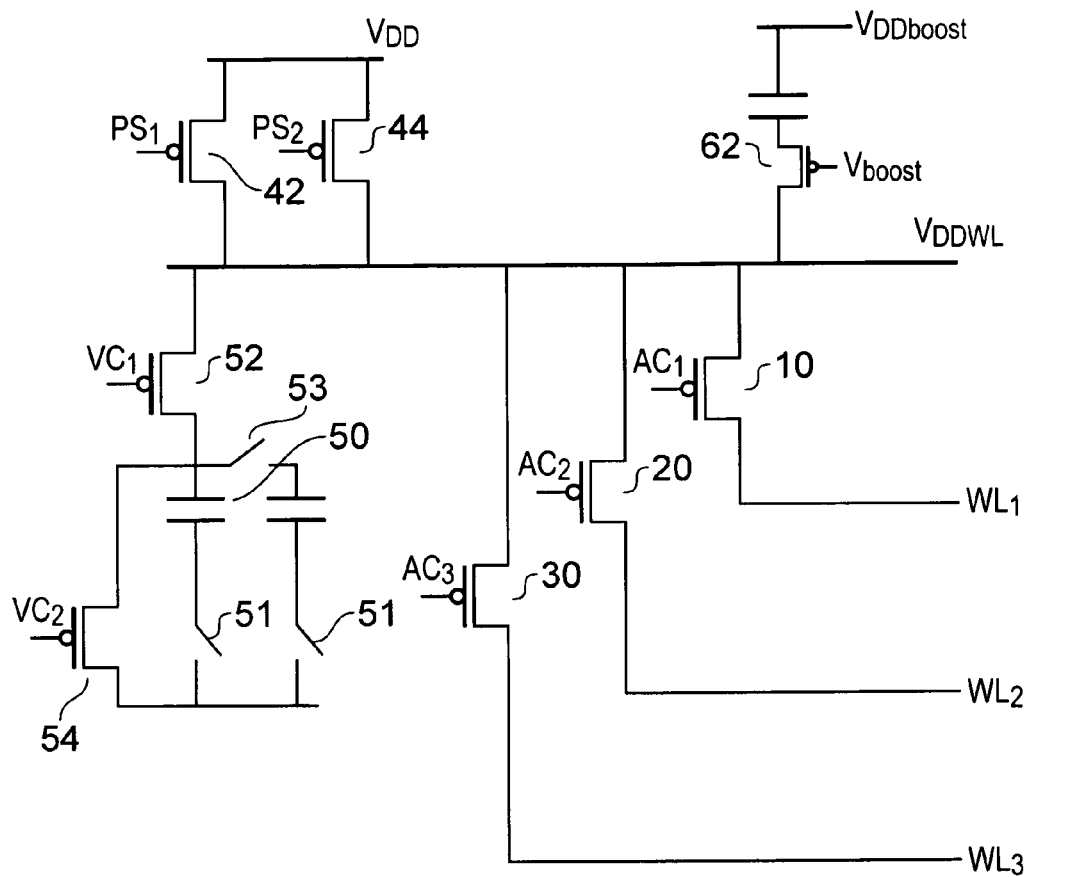
FIG. 1 shows access control circuitry according to an embodiment of the present invention.
Figure 1:
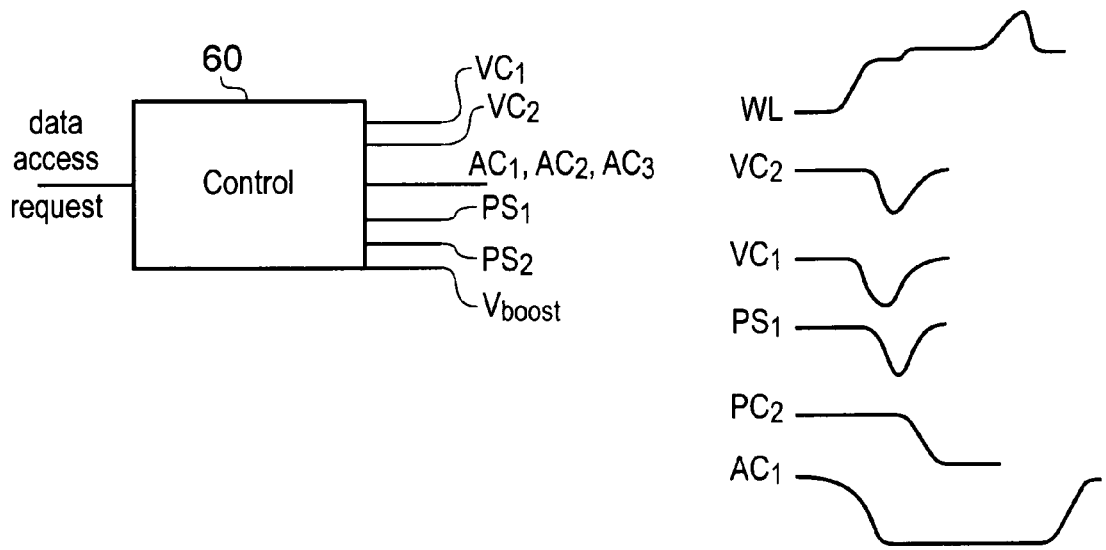

FIG. 1 shows access control circuitry according to an embodiment of the present invention. In this embodiment, there is a voltage supply line VDDWL for supplying a voltage level to word lines WL1, WL2 and WL3. This voltage supply line is connected to these word lines under the control of PMOS transistors 10, 20 and 30 which each receive control signals AC1, AC2 and AC3 respectively.

The voltage supply line VDDWL is connected to a voltage source VDD via two power transistors 42 and 44. Power transistor 44 is controlled by control signal PS2 and has a low impedance. When this transistor is turned on then the voltage level of the voltage supply line is substantially equal to that of the voltage source that is VDD. Power transistor 42 is a high impedance device and is controlled by control signal PS1. This provides a limited current to the voltage supply line and the voltage level and the voltage supply line may not be equal to the source voltage when this transistor is turned on.

Also connected to voltage supply line is a set of capacitors 50 arranged in parallel. These are connected to the voltage supply line via PMOS transistor 52 which is controlled by control signal VC1. Arranged in parallel with the capacitors and in series with the transistor 52 is a further transistor 54 which is an NMOS transistor. This is controlled by control signal VC2.

There is also access control circuitry 60 which generates the control signals that control the devices in response to a data access request.

Timing diagrams showing approximate timings of these signals are also given in FIG. 1.

As can be seen from the timing diagrams, initially the voltage supply line VDDWL is isolated from the voltage source VDD. It was previously connected to it and is therefore charged at a voltage level of VDD. Control signal VC1 then goes low which turns on transistor 52 and connects at least one of the capacitors 50 to the voltage supply line. It should be noted that there is a switch 53 between the two capacitors 50 and this switch is either open or closed depending whether one or both of the capacitors is to be connected to the voltage supply line. This is dependent upon the amount of capacitance required, which corresponds to the amount of voltage reduction required for the desired properties of the semiconductor memory. Thus, whether or not this switch is open or closed depends on the characteristics of the memory and required properties such as target read stability yield.

There are also switches 51 which are used to isolate the capacitors from the low voltage level or to connect them when the capacitors are to be discharged. In other embodiments transistor 54 may be used to discharge the capacitors. Initially switches 51 are open and thus, when VC1 turns transistor 52 on the capacitor(s) 50 will start to charge and the voltage level on the voltage supply line VDDWL will start to fall. Initially signal VC2 is high and thus, when transistor 52 turns on transistor 54 also turns on and there is a current path from the voltage supply line to the lower voltage level. Thus, current will start to flow to charge to the capacitor(s) 50 and to flow through transistors 52 and 54 to the low voltage level. After a short time delay the signal VC2 goes low and this transistor will turn off and this current path is closed.

It should be noted that in some embodiments transistor 54 is not present and there is no pull down current path and the voltage reduction on the voltage supply line is achieved simply by charging capacitor(s) 50. In this embodiment, however this would not be sufficient to reduce the voltage to the required level and thus additionally pull down transistor 54 is provided. While transistor 54 is on transistor 42 is also turned on by signal PS1. This provides a high impedance path from the voltage source to the voltage supply line. In effect transistors 42, and 52, 54 act as a voltage divider and maintain the voltage level on the voltage supply line VDDWL at an intermediate level stopping it from falling too far or from rising too close to VDD. This is important if the semiconductor memory that is being controlled by this access control device has a high capacitance which results in a large charge being pulled from the voltage supply line which without transistor 42 may result in the voltage level falling too low. The signal PS1 will stay low turning transistor 42 on for approximately the same amount of time that the pull down transistor 54 is on.

Once the voltage level on the voltage supply line has fallen one of the word line selection transistors 10, 20 or 30 is then turned on by control signal AC1, AC2 or AC3 depending on the address of the data access request. This connects the voltage supply line which now has the reduced voltage level to the selected word line and the voltage level on the word line will rise to this reduced level which is lower than the voltage level of the voltage source. The pull down transistor 54 and the high impedance power transistor 42 are then turned off and sometime later the transistor 52 that connects the capacitor(s) to the voltage supply line.

Shortly after this the signal PS2 falls and the power transistor 44 turns on and the voltage supply line rises to the voltage level of the voltage source that is VDD. As the word line is currently connected to this voltage supply line the voltage level on the word line will also rise to this voltage. The timing of this voltage rise is selected so that the pre-charging of the bit lines of the storage array has fallen somewhat and read disturbs are unlikely. The timing delay should not be too large as it manifests itself as a delay in the access cycle which then risks not completing in time.

In the case that the data access request is a write request there may be a further boost signal sent by the control circuitry which will turn transistor 62 on and will supply a boosted voltage to the voltage supply line and to the connected word line. This boosted voltage will improve the write success rate and make it more likely that the write will complete successfully. As it occurs late in the cycle it should not trigger any access disturbs in the half selected cells on the selected word line.

Figure 2A:
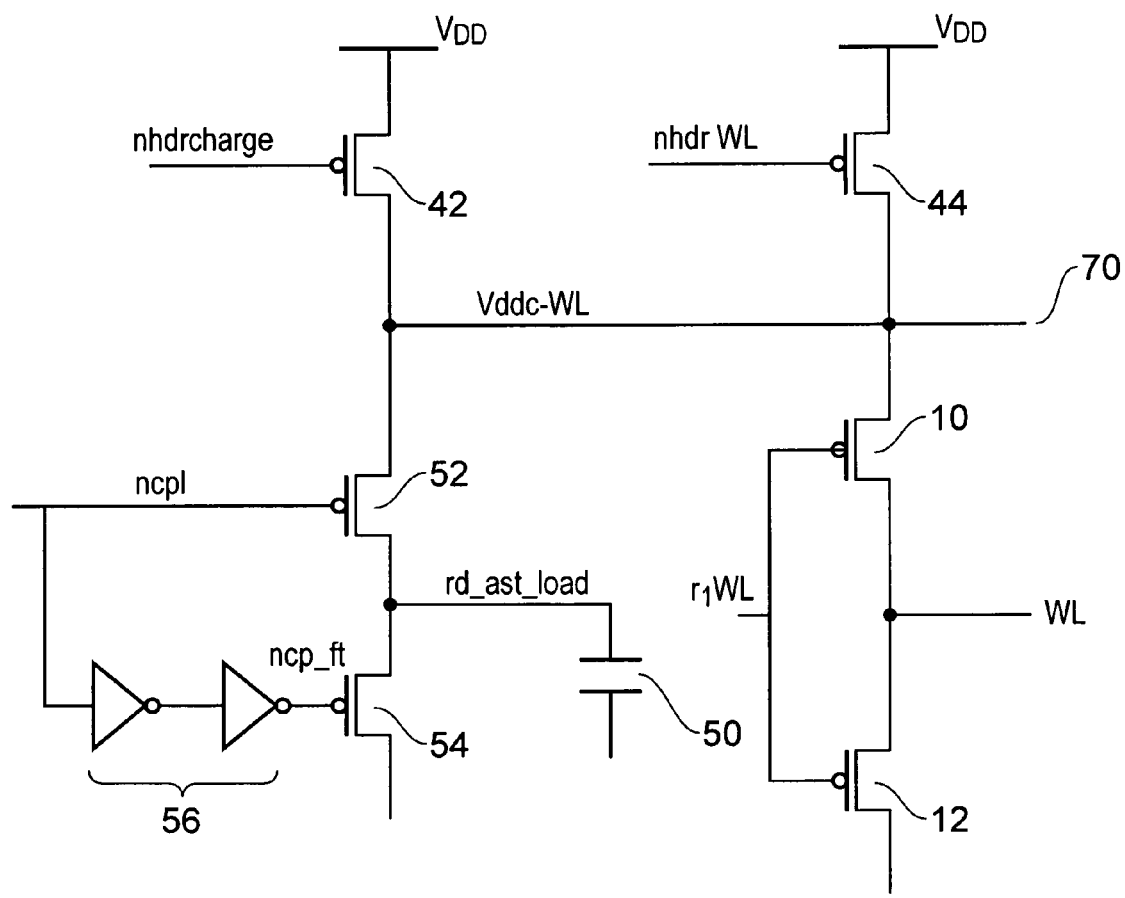
FIG. 2a shows a portion of access control circuitry according to an embodiment of the present invention.

FIG. 2A shows a further embodiment that is similar to the embodiment of FIG. 1. In this circuit there is a high impedance power transistor 42 and a low impedance power transistor 44 as in the previous embodiment. There is a voltage supply line 70 that can connect to the single word line WL that is shown in this example. In this embodiment, pull down transistor 54 is controlled by the same control signal ncpl that controls the transistor 52 that connects the capacitances 50 to the voltage supply line 70. The control signal is however sent via delay circuitry 56 which provides a delay between transistor 52 turning on and transistor 54 turning off. It should be noted that transistors 52 and 54 are different types of transistors in this embodiment, transistor 52 is a PMOS transistor and transistor 54 is an NMOS. In this way, when transistor 52 turns on transistor 54 is also on however, once the control signal that turns transistor 52 on reaches transistor 54 via the delay circuitry it will turn off. This enables delay circuitry 56 to determine the time that the pull down transistor 54 is turned on and therefore the time that there is a current path allowing current to flow from the voltage supply line 70 to ground. Once transistor 54 is off there is still a current path through transistor 52 to capacitor 50 and the voltage level on the voltage supply line will fall further while capacitor 50 is charging. During this time transistor 44 is turned off, however, while transistor 54 is on, transistor 42 is also on. Transistor 42 has a high impedance and will provide current for maintaining the charge and voltage on word line 70 at a certain level, this is important for semiconductor memories which have a high capacitance word line which might otherwise pull the voltage of the voltage supply line down too low.

Although the switching circuitry has been shown in these embodiments as transistors it should be clear to a skilled person that any type of switching circuitry that can be controlled by control signals to either connect or isolate various components could be used. Furthermore, although in some cases NMOS and PMOS transistors are shown it will be clear to a skilled person that the alternative transistors can be used provided the plurality of control signals are switched.

Figure 2B:
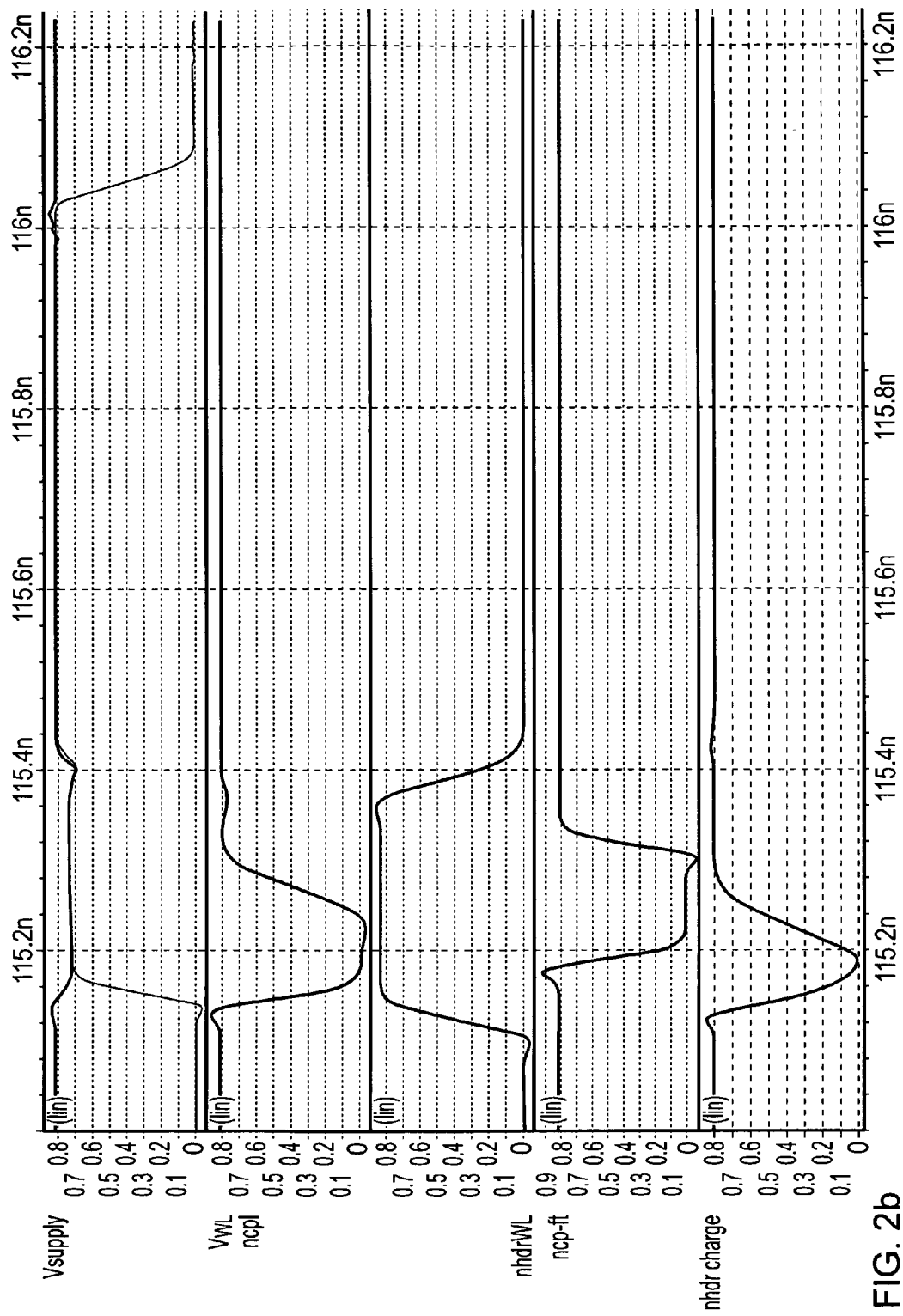

FIG. 2b shows timing diagrams illustrating the change in voltage levels of the control signals and the corresponding changes in voltage levels on the voltage supply line and the word line. Graph 1 at the top of the page shows how the voltage on the voltage supply line and the voltage on the word line vary. Thus, the voltage on the voltage supply line is pulled down to a certain level prior to the word line being connected to it. The voltage on both lines later rises to the value of the voltage source VDD. In this embodiment there is no voltage boost to the signal. This may be because there is no boost circuitry associated with this embodiment or it may be because the illustrated request is a read request.

A second graph on the figure shows the control signal ncpl which controls transistor 52 and connects the capacitor 50 to the voltage supply line. Thus, one can see that as this falls low the voltage supply line's voltage falls. This occurs prior to the word line being connected to the voltage supply line. However, the capacitor is not turned off until after the word line is connected to the voltage supply line. The word line is connected to the voltage supply line via transistor 10 in response to control signal $r_1$wl. There is a transistor of opposite polarity 12 connected below the word line also controlled by this signal. Thus, depending on the signal $r_1$wl the word line is either connected to the voltage supply line via transistor 10 and pulled high or it is connected via transistor 12 to ground and pulled low. This avoids the word line from floating.

The signal controlling transistor 44 $nh_rWL$ that connects the voltage supply line 70 to the source voltage level VDD is shown in the next graph. As can be seen the power is disconnected from the voltage supply line prior to the capacitor 50 being connected to it and it is later reconnected to the voltage supply once the capacitor has been disconnected from the voltage supply line. When it is reconnected the voltage supply line and the connected word line voltage rise.

The fourth graph down shows the delay signal ncp-ft controlling transistor 54. This signal is high at the beginning so that transistor 54 is on when transistor 52 first turns on however it falls quickly turning transistor 54 off. It later rises but at this time transistor 52 is off and therefore it does not connect transistor 54 to the vddwl, rather it provides a path for discharging the charge stored in the capacitor 50 which resets it for the next cycle.

The final signal is the signal controlling high impedance transistor 42 and as can be seen this is turned on for about the same time that pull down transistor 54 is on. Thus, there is for some time a current path through a high impedance transistor to the voltage supply line while the voltage supply line is connected to earth.

Figure 2C:
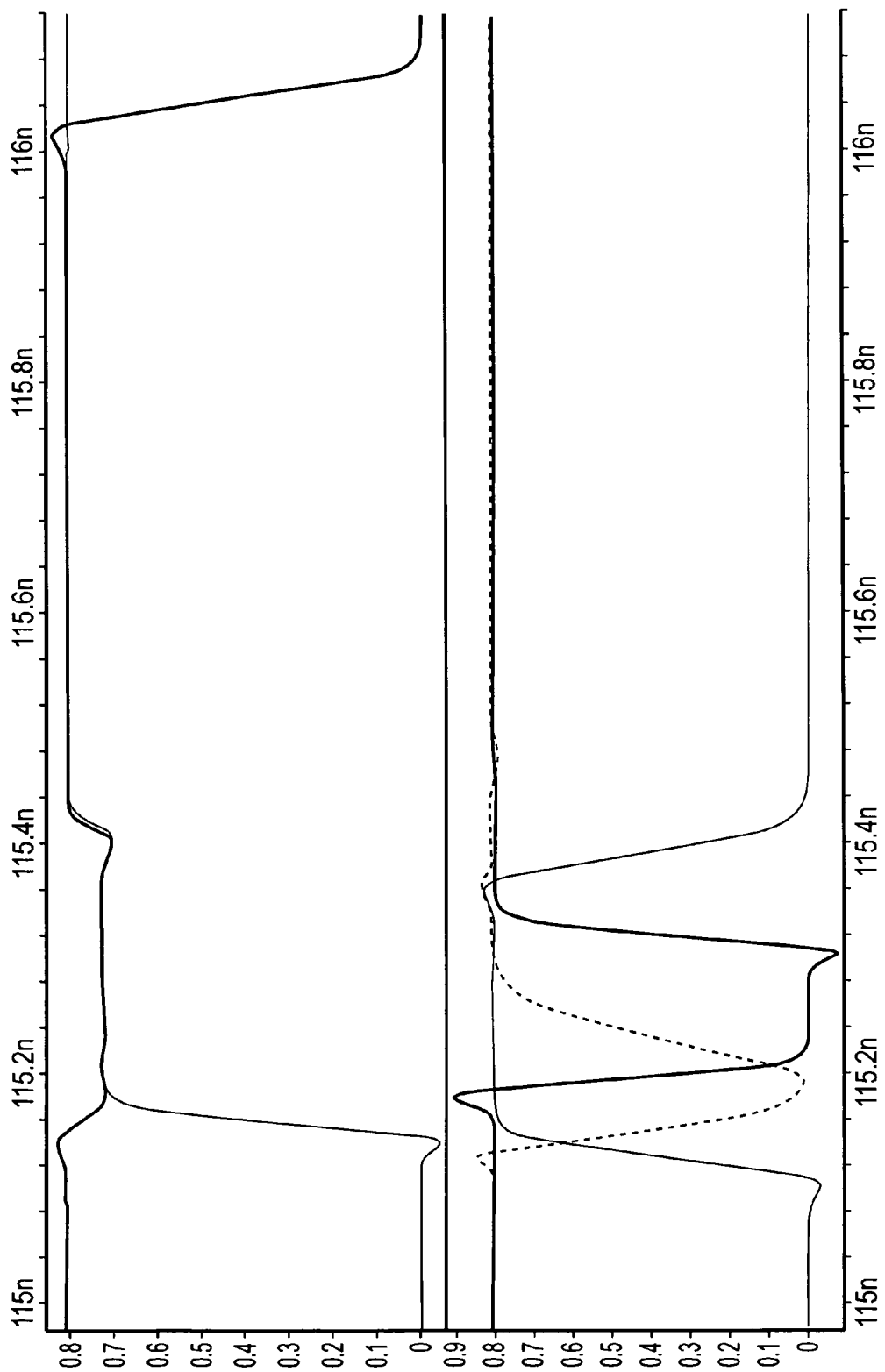
FIG. 2c shows timing diagrams illustrating how the control signals act at a same time to control the voltage on the word line.

FIG. 2c shows a single graph having all the curves on it, such that the relative timings can be seen.

In summary the word line is connected to the voltage supply line near the beginning of the access cycle once the voltage level on the voltage supply line has fallen due at least partly to the charging of capacitor 50. It is advantageous that this occurs near the start of the cycle as it reduces any delay on the data access cycle. The word line is connected to the voltage supply line while the pull down transistor 54 and the high impedance power transistor are still connected to it. This enables the high impedance power transistor to provide the word line with current if required. For example, if the word line has a high capacitance and pulls a lot of charge from the voltage supply line. A capacitance word line occurs in semiconductor memory devices that are wide and have many storage cells on a row. Allowing current to flow from the voltage source albeit through a high impedance device enables the voltage level on the voltage supply line to be maintained at the required level. In this regard while devices 42, 52 and 54 are all on they act as a voltage divider maintaining the voltage level at or close to the required level.

The pull down transistor 54 and high impedance power transistor 42 are turned off quite soon after connection of the word line and sometime later the transistor 52 is turned off and the capacitor(s) 50 are isolated from the voltage supply line and the word line. Sometime after this the low impedance transistor 44 is turned on and the voltage supply line is connected to the voltage source VDD and the voltage on the word line rises.

Figure 3:
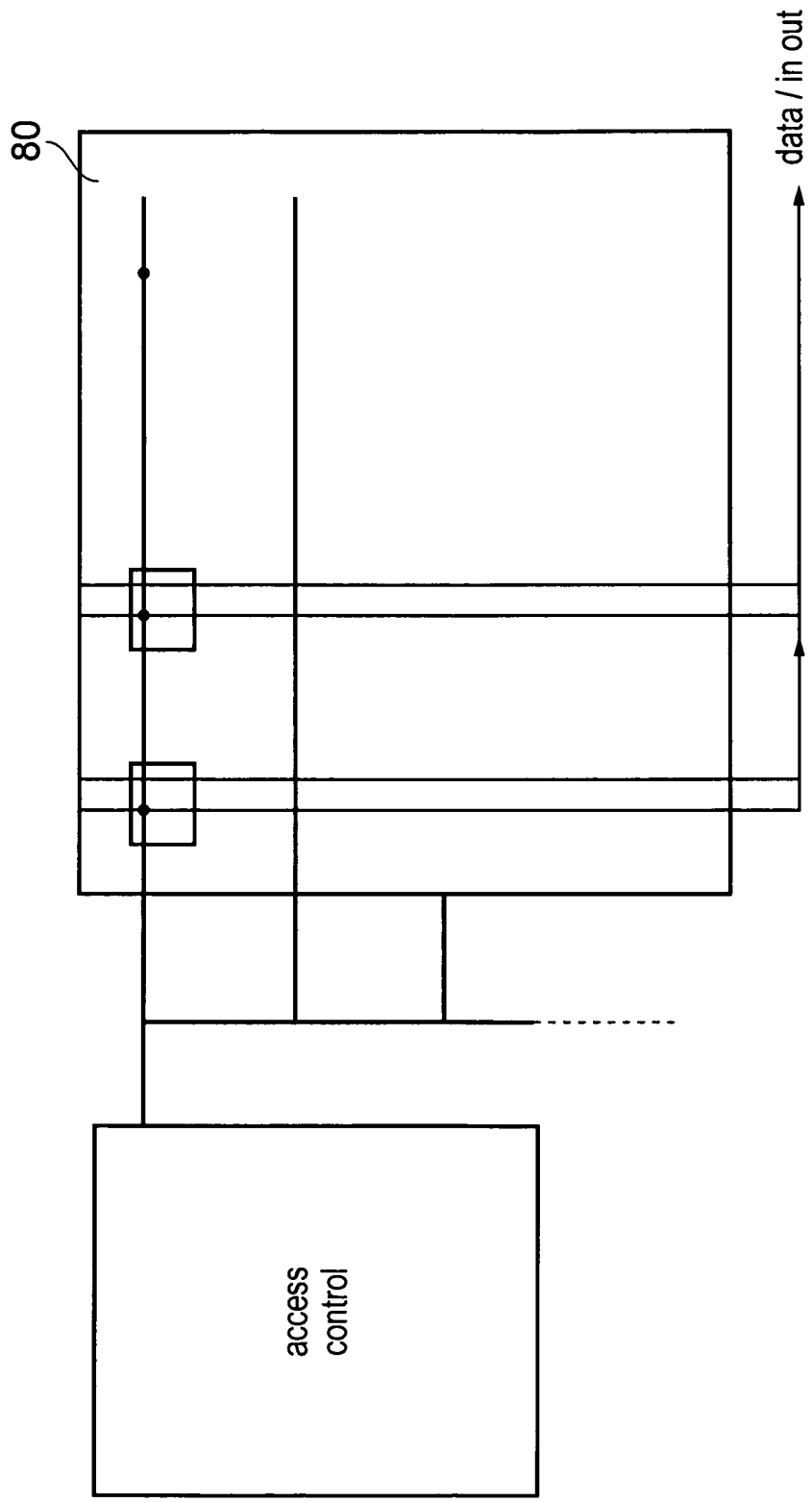
FIG. 3 shows a semiconductor memory device according to an embodiment of the present invention.

FIG. 3 shows access control circuitry schematically connected to an SRAM memory 80. This shows a plurality of word lines going along the rows of the storage cells with bit lines and complementary bit lines running along the columns. Data is input and output from the storage cells via these bit lines and complementary bit lines and access to the storage cells is controlled via the signal on the word lines.

Figure 4:
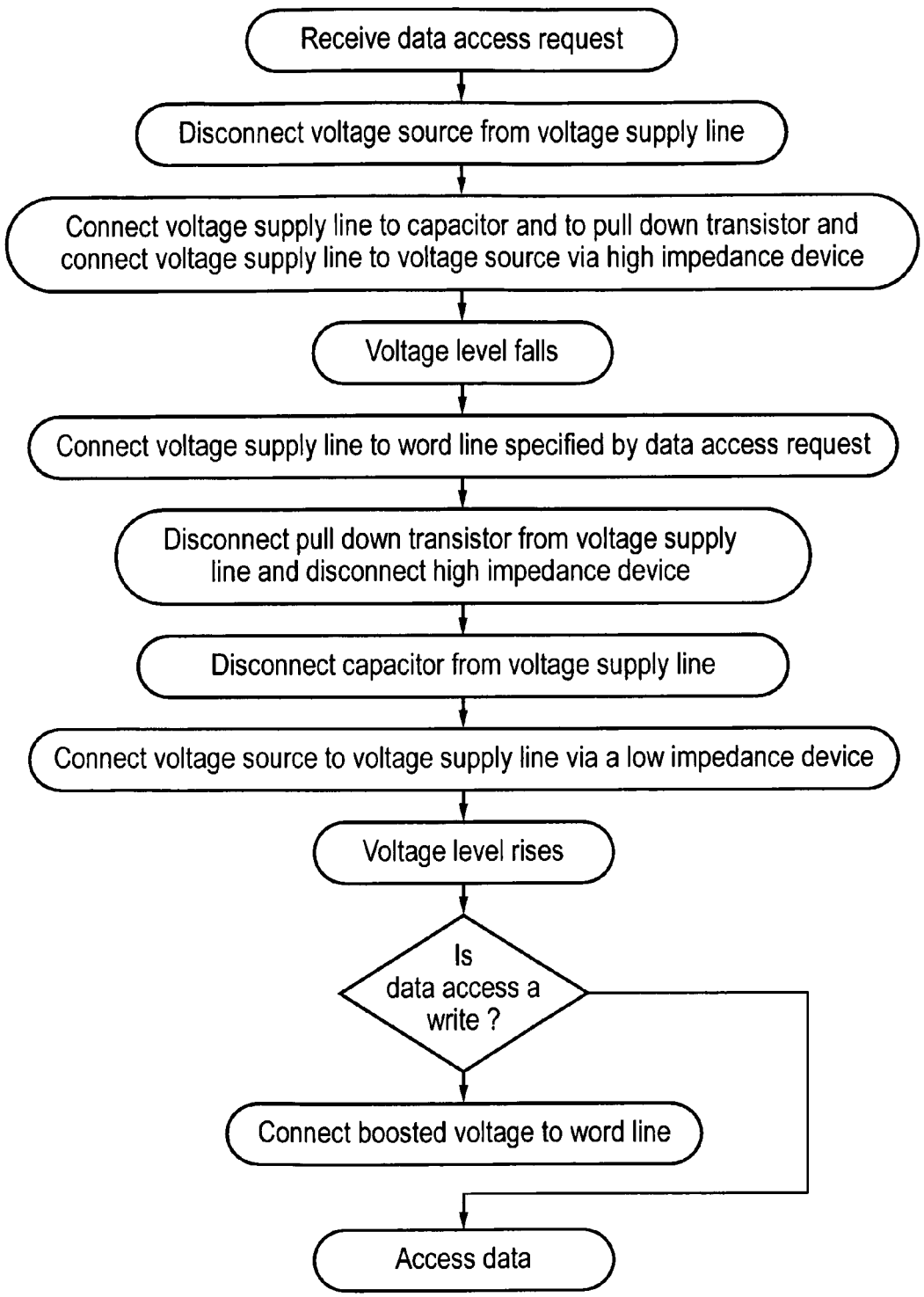
FIG. 4 shows a flow diagram illustrating steps in a method according to an embodiment of the present invention.

FIG. 4 shows a flow diagram illustrating steps in a method according to an embodiment of the present invention. Initially a data access request is received and the data access cycle starts. The voltage source is disconnected from the voltage supply line which is at this point charged to the voltage level of the voltage source. The voltage supply line is then connected to a capacitor and to a pull down transistor and the voltage level starts to fall. At the same time the voltage supply line is connected to the voltage source via a high impedance device which acts with the pull down transistor as a voltage divider to maintain the voltage level on the voltage supply line at a steady reduced voltage. Once the voltage level has fallen the voltage supply line is connected to the word line that is specified by the data access request and thus, the word line sees a voltage level that is less than the voltage level of the voltage source.

The presence of the high impedance device and the pull down transistor at this point acts like a voltage divider between the voltage supply line and voltage source and the low voltage level and maintains the word line at this reduced voltage for the initial current flow. This is important for the cases where the semiconductor memory has long word lines with high capacitances and may draw a high current. In this case, the high impedance device can supply current to the voltage supply line and via this to the word line to maintain the voltage level at the required level. This voltage dividing mechanism also prevents the word line from rising towards the level of the voltage source.

The pull down transistor and the high impedance device are then disconnected and the word line and voltage supply line float. The capacitor is then disconnected from the voltage supply line and the voltage source is connected to the voltage supply line via a low impedance device. This brings the voltage level of the voltage supply line and the word line to which it is connected to the voltage level of the voltage source. The rise of the word line to this voltage level occurs after a predetermined time in the access cycle and at this point the pre-charged bit lines will have lost some of their charge and the chances of an access disturb to half selected cells is significantly reduced.

It is then determined if the data access is a write. If it is a write then a boosted voltage is at this point connected to the word line and this will increase the probability of the write being successful. If it is not a write then no boosted voltage is connected to the word line. The data is then accessed.

Although illustrative embodiments have been described in detail herein with reference to the accompanying drawings, it is to be understood that the claims are not limited to those precise embodiments, and that various changes and modifications can be effected therein by one skilled in the art without departing from the scope and spirit of the appended claims. For example, various combinations of the features of the following dependent claims could be made with the features of the independent claims.

We claim:

1. A semiconductor memory storage device for storing data comprising:
    a plurality of storage cells for storing said data, each storage cell comprising an access control device configured to provide said storage cell with access to or isolation from a data access port in response to an access control signal;
    access control circuitry configured to transmit said access control signal along one of a plurality of access control lines to control a plurality of said access control devices connected to said one of said plurality of access control lines;
    said access control circuitry comprising:
        a voltage supply line for supplying voltage to said access control lines;
        at least one capacitor;
        voltage control switching circuitry for connecting said at least one capacitor to said voltage supply line; and
        access control line switching circuitry for connecting a selected access control line to said voltage supply line; wherein
    said access control circuitry is configured to respond to a data access request signal to access a selected storage cell connected to a corresponding selected access control line to:
    control said voltage control switching circuitry to connect said at least one capacitor to said voltage supply line such that said at least one capacitor is charged by said voltage supply line and a voltage level on said voltage supply line is reduced; and
    to control said access control line switching circuitry to connect said selected access control line to said voltage supply line having said reduced voltage level.

2. A semiconductor memory storage device according to claim 1, said access control circuitry further comprising pull down switching circuitry for connecting said voltage supply line to a low voltage source, said access control circuitry being configured to control said pull down switching circuitry to provide a connection between said voltage supply line and said low voltage source at substantially a same time as controlling said voltage control switching circuitry to connect said at least one capacitor to said voltage supply line.

3. A semiconductor memory storage device according to claim 2, wherein said voltage control switching circuitry and said pull down switching circuitry are transistors of opposite types arranged in series with each other, said voltage control transistor being switched on causing said pull down transistor to switch on, said access control circuitry further comprising delay circuitry, said control signal turning said voltage control transistor on being transmitted to said pull down transistor via said delay circuitry and causing said pull down transistor to switch off after a delay determined by said delay circuitry.

4. A semiconductor memory storage device according to claim 1,
    said access control circuitry further comprising first power switching circuitry for connecting and isolating said voltage supply line with a voltage source;
    said access control circuitry being configured to respond to said data access control request to control said first power switching circuitry to isolate said voltage supply line from said voltage source prior to connecting said at least one capacitor to said voltage supply line; and
    to control said first power switching circuitry to connect said voltage supply line to said voltage source a predetermined time after said selected access control line is connected to said voltage supply line such that said voltage level of said voltage supply line is increased.

5. A semiconductor memory storage device according to claim 4,
    said access control circuitry further comprising further power switching circuitry for connecting and isolating said voltage supply line with said voltage source, said further power switching circuitry providing a high impedance connection between said voltage supply line and said voltage source, said access control circuitry being configured to respond to said data access control request to control said further power switching circuitry to provide a connection between said voltage supply line and said voltage source at substantially a same time as said pull down switching circuitry is connected to said voltage supply line.

6. A semiconductor memory storage device according to claim 5, wherein said access control circuitry is configured to control said access control line switching circuitry to connect said selected access control line to said voltage supply line having said reduced voltage level prior to switching said pull down switching circuitry off.

7. A semiconductor memory storage device according to claim 1,
said access control circuitry further comprising voltage boost circuitry for providing a voltage boost to said access control line and delay circuitry; wherein
said access control circuitry is responsive to said data access request being a write request to connect said access control line to a boosted voltage level higher than said voltage level of said voltage source a certain time after said voltage supply line is connected to said access control line.

8. A semiconductor memory storage device according to claim 1, wherein a capacitance of said at least one capacitor connected to said voltage supply line is selected in dependence upon characteristics of said semiconductor memory storage device.

9. A semiconductor memory storage device according to claim 8, wherein said at least one capacitor comprises a plurality of capacitors arranged in parallel said access control circuitry being configured to select said capacitance by selecting a number of said plurality of capacitors to connect to said voltage supply line.

10. A semiconductor memory storage device according to claim 9, wherein said number of said plurality of capacitors is selected in dependence upon a target read stability of said semiconductor memory storage device.

11. A semiconductor memory storage device according to claim 9, wherein said number of said plurality of capacitors is selected in dependence upon a detected value of said reduced voltage level.

12. A semiconductor memory storage device according to claim 9, wherein said number of said plurality of capacitors is selected in dependence upon a target value of said reduced voltage level.

13. A semiconductor memory storage device according to claim 1, wherein a capacitance of said at least one capacitor connected to said voltage supply line is between 5 and 35% of said capacitance on said voltage supply line.

14. A semiconductor memory storage device according to claim 1, wherein said plurality of storage cells are arranged in at least one array comprising a plurality of rows, a corresponding plurality of access control lines, a plurality of columns and a corresponding plurality of data lines and complementary data lines, each of said storage cells comprising two access control devices for controlling access to said data line and said complementary data line.

15. A semiconductor memory storage device according to claim 14, wherein said array of storage cells comprises an SRAM memory.

16. A method of providing data access to a semiconductor memory storage device comprising a plurality of storage cells for data, each storage cell comprising an access control device configured to provide said storage cell with access to or isolation from a data access port in response to an access control signal, said method comprising:
in response to a data access request:
connecting at least one capacitor to said voltage supply line such that said at least one capacitor is charged by said voltage supply line and a voltage level of said voltage supply line is reduced;
connecting said voltage supply line having a reduced voltage level to an access control line, said access control line transmitting said access control signal to a plurality of said access control devices providing access to a corresponding plurality of said storage cells.

17. A method according to claim 16, said method further comprising:
connecting said voltage supply line to a low voltage source via pull down switching circuitry at substantially a same time as controlling said voltage control switching circuitry to connect said at least one capacitor to said voltage supply line and disconnecting said voltage supply line from said low voltage source after a predetermined delay.

18. A method according to claim 16, comprising the further steps of:
disconnecting said at least one capacitor from said voltage supply line once said voltage level has reduced; and
following connecting said voltage supply line having a reduced voltage level to said access control line connecting said voltage supply line to a voltage source such that a voltage level of said voltage supply line rises to a voltage level of said voltage source.

19. A semiconductor memory storage means for storing data comprising:
a plurality of storage cells for storing said data, each storage cell comprising an access means for providing said storage cell with access to or isolation from a data access port in response to an access control signal;
access control means for transmitting said access control signal along one of a plurality of access control lines to control a plurality of said access means connected to said one of said plurality of access control lines;
said access control means comprising:
a voltage supply line means for supplying voltage to said access control lines;
at least one capacitor;
voltage control switching means for connecting said at least one capacitor to said voltage supply line; and
access control line switching means for connecting a selected access control line to said voltage supply line; wherein
said access control means is for accessing a selected storage cell connected to a corresponding selected access control line in response to a data access request signal by:
controlling said voltage control switching circuitry to connect said at least one capacitor to said voltage supply line such that said at least one capacitor is charged by said voltage supply line and a voltage level on said voltage supply line is reduced; and
controlling said access control line switching circuitry to connect said selected access control line to said voltage supply line having said reduced voltage level.

20. A computer program product comprising a computer program which when executed on a computer causes said computer to generate a layout for a semiconductor memory storage device according to claim 1.

* * * * *

UNITED STATES PATENT AND TRADEMARK OFFICE
CERTIFICATE OF CORRECTION

| | | |
|---|---|---|
| PATENT NO. | : 8,611,172 B2 | Page 1 of 1 |
| APPLICATION NO. | : 13/476218 | |
| DATED | : December 17, 2013 | |
| INVENTOR(S) | : Shanmugam et al. | |

It is certified that error appears in the above-identified patent and that said Letters Patent is hereby corrected as shown below:

On the Title Page, item (75) Inventor "Amaranth Shyanmugam" should read "Amarnath Shanmugam"

On the Title Page, item (75) Inventor "Vincent Phillipe Schuppe" should read "Vincent Philippe Schuppe"

Signed and Sealed this
Twenty-fifth Day of November, 2014

Michelle K. Lee
*Deputy Director of the United States Patent and Trademark Office*